United States Patent [19]

Jungblut et al.

[11] Patent Number: 5,034,749

[45] Date of Patent: Jul. 23, 1991

[54] SLIDING CONTACT TEST APPARATUS

[75] Inventors: John R. Jungblut, Escondido; David A. Bruno, San Diego, both of Calif.

[73] Assignee: Electro Scientific Industries, Inc., Portland, Oreg.

[21] Appl. No.: 410,315

[22] Filed: Sep. 21, 1989

Related U.S. Application Data

[63] Continuation-in-part of Ser. No. 254,355, Oct. 6, 1988.

[51] Int. Cl.$^5$ .............................................. G01R 15/12
[52] U.S. Cl. ............................... 324/158 F; 324/73.1; 209/573
[58] Field of Search ............... 324/158 F; 439/11, 13, 439/23, 24, 25; 209/573

[56] References Cited

U.S. PATENT DOCUMENTS

| | | | |
|---|---|---|---|
| 3,239,059 | 3/1966 | Cole, Jr. et al. | 324/158 F |
| 4,747,479 | 5/1988 | Herrman | 324/158 F |
| 4,790,438 | 12/1988 | Wichelm et al. | 324/158 F |
| 4,818,382 | 4/1987 | Anderson et al. | 324/158 F |

OTHER PUBLICATIONS

Frisbie, Pass through Test Socket for Semiconductor Devices, 2/86, PCT WO86/01133.

Primary Examiner—Reinhard J. Eisenzopf
Assistant Examiner—Edward Urban
Attorney, Agent, or Firm—Stoel Rives Boley Jones & Grey

[57] ABSTRACT

The apparatus (20) includes electrically conductive contacts (44, 54) that are spaced apart a distance slightly less than the distance between the terminals (34, 36) formed on the components (24) to be tested. One contact (54) is held in position by a spring (112). The other contact (44) is stationary. The contacts (44, 54) slide against the terminal surfaces (52, 56) of the components (24) that are conveyed into a test location (26) between the contacts. The apparatus employs few moving parts and the sliding motion of the contacts (44, 54) against the terminal surfaces (52, 56) ensures that the contacts (44, 54) penetrate any oxide layer present on the terminal surfaces (52, 56). In an alternative embodiment (160), two sets of contacts (44L, 44T, 54L, 54T) are employed for testing components (24) in two adjacent test locations (26L, 26T). One configuration of a movable contact (304) is such that minimal force is applied to the terminal surfaces (52, 56) of the components (24) so that the components may be tested without marking or damaging the surfaces (52, 56).

12 Claims, 5 Drawing Sheets

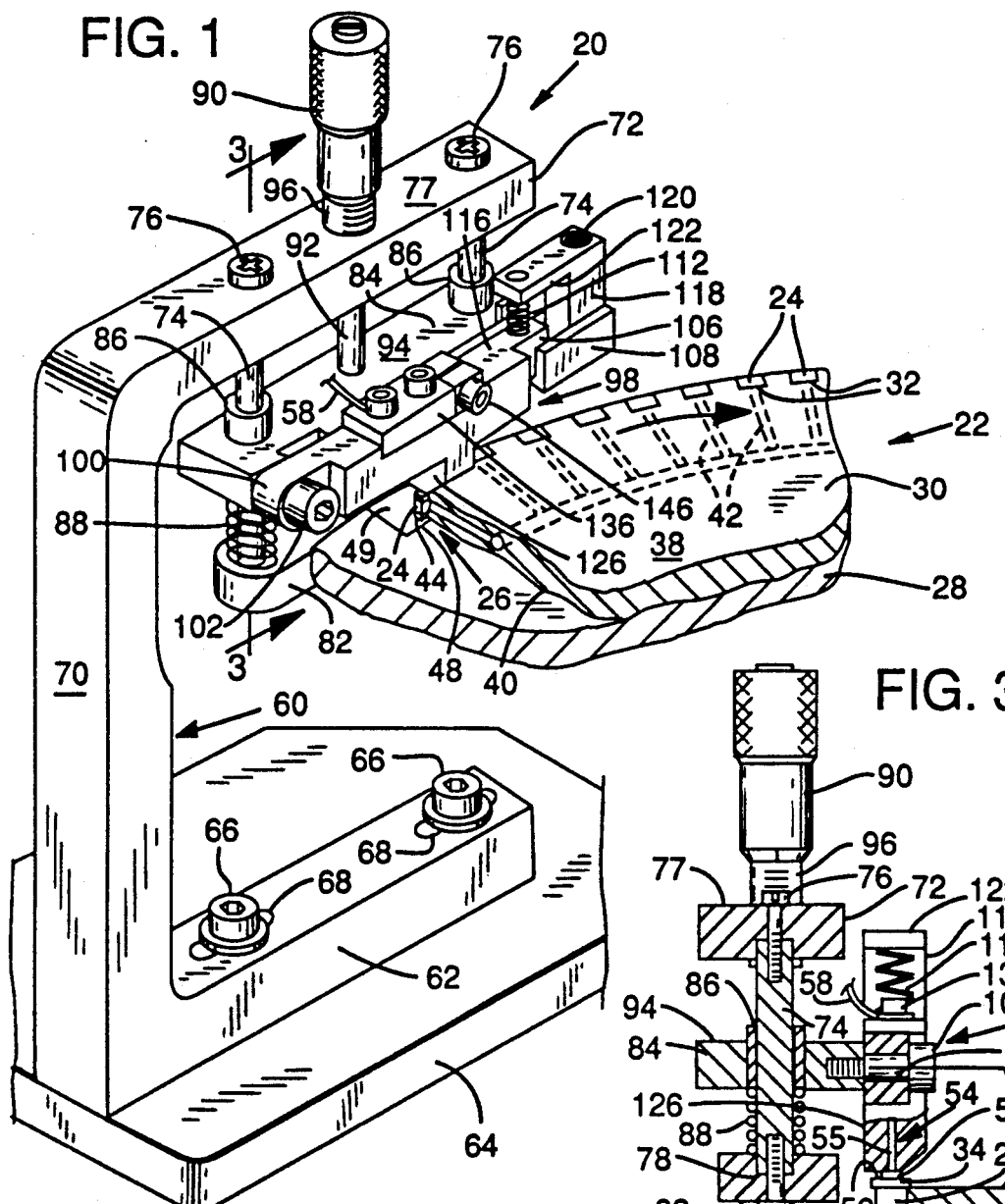

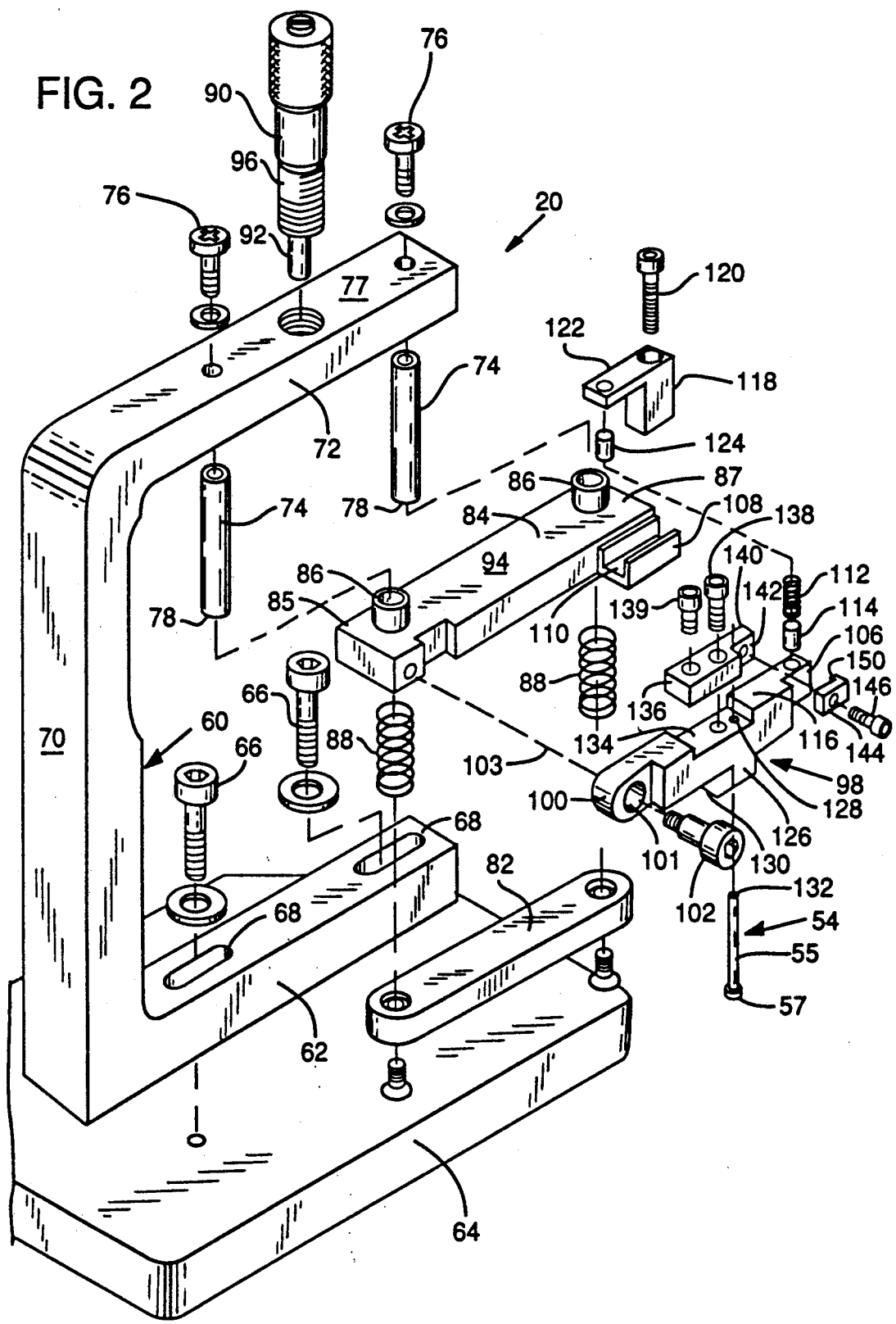

SLIDING CONTACT TEST APPARATUS

CROSS-REFERENCE TO RELATED APPLICATION

This is a continuation-in-part of U.S. patent application No. 07/254,355, filed Oct. 6, 1988.

TECHNICAL FIELD

This invention pertains to equipment for testing electronic components and, particularly, to mechanisms for moving the components into and out of engagement with the contacts of a test apparatus.

BACKGROUND INFORMATION

Manufactured electronic components are usually tested prior to sale. Conventional devices for testing the components include test probes or contacts that are moved into engagement with the component terminals. The probes conduct electrical signals between the component and test equipment for measuring the performance characteristics of the component.

A capacitor is an example of an electronic component that is amenable to testing with the type of test device just mentioned. The capacitors of concern here are generally block-shaped and have a conductive terminal applied to each of two opposing ends. Each capacitor terminal has a generally flat outermost surface.

The test probes of typical test devices are controlled to travel toward and away from the terminal surfaces in a direction generally perpendicular to the planes of the terminal surfaces. After the testing is completed, the tested capacitors are replaced with untested capacitors, and the process is repeated.

Prior test devices that move test probes as just described are generally complex and, therefore, costly to manufacture and maintain. Further, prior test devices perform inadequately when testing components that have nickel terminals. In this regard, the use of nickel-plating techniques for forming electronic component terminals has become increasingly popular in recent years. As is known, the surfaces of nickel terminals develop thin oxide layers. Conventional test probes often fail to penetrate the oxide layer. Whenever the probes fail to penetrate the oxide layer, the test device will collect inaccurate test data. Further, the probes of prior devices must be cleaned frequently because the nickel oxide tends to accumulate on the probe tips.

SUMMARY OF THE INVENTION

This invention is directed to an apparatus for rapid and reliable testing of electronic components, irrespective of whether the components have nickel terminals.

The apparatus of the present invention includes two exposed electrical contacts that are connected to a test bridge. One contact is stationary and the other contact is movable. In one embodiment, the movable contact is spring-biased into a position that is spaced from the stationary contact a distance that is slightly less than the distance between the opposing terminal surfaces of the component. As a component such as a capacitor is slid between the contacts, the movable contact compresses the spring as that contact is forced away from the stationary contact. Consequently, the compressed spring forces the contacts against the associated terminals of the capacitor so that the contacts penetrate the oxide layer formed on the surface of nickel terminals. Further, the sliding action cleans the contacts, thereby reducing contact maintenance requirements.

The contacts are fastened to the apparatus in a manner that permits rapid replacement in the event of contact wear.

In one embodiment, a single stationary contact and a single movable contact are employed. The movable contact is carried by a holder. The holder is mounted to a position adjustment mechanism that permits precise positioning of the movable contact so that batches of electronic components of varying sizes may be tested by a single apparatus.

In another embodiment, two adjacent sets of movable and stationary contacts are used. The use of two movable/stationary contact sets expedites testing of capacitors.

In many applications, components that have terminals that are marked or damaged as a result of testing are unacceptable. As another aspect of this invention, the movable contact of one embodiment is mounted in cantilever fashion and configured so that little contact force is produced as a component is slid between the movable and stationary contacts. Consequently, the force applied by the contacts to the terminal surfaces of the components is minimized at a level that ensures the contacts penetrate the terminal surface oxide layer without significantly marking or damaging the terminals. In this regard, the above-mentioned position adjustment mechanism is useful for adjusting the movable contact position so that the resultant contact force against the terminals is sufficient to penetrate the oxide layer without marking the terminals.

BRIEF DESCRIPTION OF THE DRAWINGS

FIG. 1 is a perspective view of a preferred embodiment of the present invention.

FIG. 2 is an exploded perspective view of the embodiment of FIG. 1.

FIG. 3 is a sectional view taken along line 3—3 of FIG. 1, showing a capacitor in a test location.

DESCRIPTION OF PREFERRED EMBODIMENTS

Figure 4:
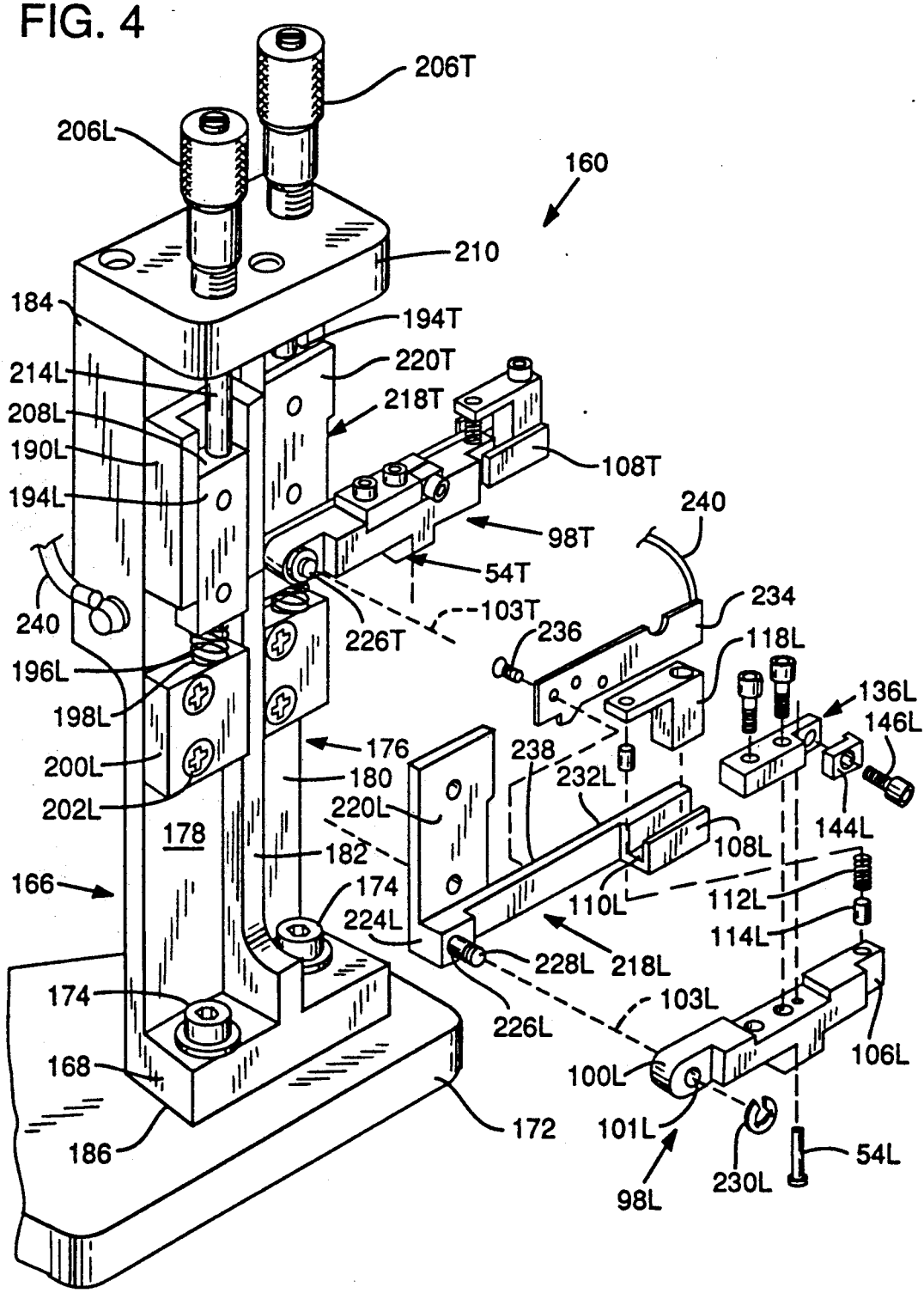
FIG. 4 is a perspective view, partly exploded, of an alternative embodiment of the present invention.

With reference to FIGS. 1 through 3, a preferred embodiment of the sliding contact test apparatus 20 of the present invention is preferably employed in conjunction with a rotary-type conveyance system 22 that moves electronic components such as capacitors 24 into and out of a test location 26. The performance characteristics of each capacitor 24 are measured during the time the capacitor 24 is in the test location 26.

The rotary conveyance system 22 includes a circular base plate 28 over which a circular drive plate 30 is rotatably mounted. The drive plate 30 is formed of electrically nonconductive material and includes a plurality of notches 32 formed in the outer edge. The notches 32 are sized to carry capacitors 24 oriented so that the opposing terminated ends 34, 36 of the capacitors 24 protrude slightly above the respective planes of the flat top surface 38 and flat bottom surface 40 of the drive plate 30. It will become clear upon reading this description that the rotary-type conveyance system for moving electronic components could be replaced with any suitable means for conveying the components to the test location 26.

The capacitors 24 are held within the notches 32 by suction that is applied through ports 42. The method of filling and emptying the notches 32 with the capacitors 24 is known in the art and forms no part of this invention. One method for filling and emptying such notches is described in U.S. Pat. No. 4,753,061.

The rotation of the drive plate 30 is precisely controlled by a stepper motor (not shown) to move each capacitor 24 into and out of the test location 26. In accordance with the present invention, the test location 26 is above an electrically conductive stationary contact 44 that is mounted to the edge of the circular base plate 28. The stationary contact 44 comprises a headed pin that extends through an electrically nonconductive support member 48, which member 48 is inset within a correspondingly shaped opening in the edge of the base plate 28. The head 45 of the contact 44 protrudes from the flat top surface 49 of the support member 48.

The end 47 of the shaft 51 of the stationary contact 44 extends beyond the bottom surface 29 of the base plate 28 (see FIG. 3). A terminal block 59 is fastened to that bottom surface 29 and serves to clamp the contact 44 in position and to provide means for connecting the contact to a lead 50 that extends to a test bridge (not shown). The terminal block 59 is fastened to the bottom surface 29 by a fastener 61 that threads into the base plate 28. Another fastener 63 is threaded into the terminal block 59 to secure the end of lead 50 thereto.

One end of the terminal block 59 has a tongue 65 extending therefrom. The tongue 65 includes a flat clamp surface 67 that faces the end 47 of the shaft 51. The shaft end 47 extends across the clamp surface 67 near the junction of the tongue 65 and the terminal block 59. The end 47 of the contact shaft 51 is clamped against the clamp surface 67 by a clamp member 71. The clamp member 71 is tightened against the shaft end 47 by a threaded fastener 73 that extends through the clamp member 71 and into a threaded aperture formed in the clamp surface 67. The clamp member 71 resembles a conventional square nut and includes a protruding lip 75 that extends outwardly toward the clamp surface 67 for a distance equal to the diameter of the shaft 51. The lip 75 ensures that the clamp member 71 will bear evenly upon the shaft end 47. It can be appreciated that the stationary contact 44 may be rapidly replaced by loosening the fastener 73 (hence, loosening the clamp member 71) so that the contact 44 is free to slide out of the support member 48.

As a capacitor 24 is moved into the test location 26, the surface 52 of the lower terminal 36 of the capacitor slides over the exposed head 45 of the stationary contact 44. A movable contact 54, best seen in FIG. 3, is held by hereafter described mechanisms above the stationary contact 44. The movable contact 54 is positioned to slide across the surface 56 of the upper terminal 34 of the capacitor 24 as the capacitor is moved into the test location 26. As described more fully below, the movable contact 54 is electrically connected via a lead 58 to the test bridge.

The capacitor 24 is held in the test location 26 for a time sufficient to gather test data, and the drive plate 30 is then rotated to position the next capacitor within the test location. Tested capacitors 24 are removed from the drive plate notches 32, and the empty notches 32 are filled with untested capacitors 24 as the test procedure continues.

Turning now to the particulars of the mechanisms for precisely positioning the movable contact 54 relative to the stationary contact 44, and with particular reference to FIG. 2, the test apparatus 20 includes a generally C-shaped rigid stand 60. The lower leg 62 of the stand 60 is fastened to a base 64 that is formed of electrically nonconductive material and that extends partly beneath the circular base plate 28 and drive plate 30. The lower leg 62 of the stand 60 is formed with openings 68 through which threaded fasteners 66 pass to secure that leg 62 to the base 64. The openings 68 have elongated cross sections to permit precise positioning of the stand 60 for aligning the movable contact 54 with the stationary contact 44.

The middle leg 70 of the stand 60 extends upwardly from the end of lower leg 62. The upper leg 72 of the stand 60 extends outwardly from the middle leg 70 along an axis that is substantially parallel to that of the lower leg 62. Two cylindrical shafts 74 are secured by fasteners 76 to depend downwardly from the underside of the upper leg 72 of the stand 60. The shafts 74 are spaced apart, and their lower ends 78 are fastened to opposing ends of a rigid bar 82.

A support block 84 is mounted to move along the shafts 74. The support block 84 includes two bushings 86, one bushing being pressed into each end 85, 87 of the block 84. Each shaft 74 passes through a bushing 86, thereby permitting the block 84 to slide along the shafts 74.

Each shaft 74 also extends through a compression spring 88 that is positioned between the support block 84 and the bar 82. Consequently, the support block 84 is continuously biased by the springs 88 toward the upper leg 72 of the stand 60.

A micrometer head 90 is threaded through the upper leg 72 of the stand 60. The stem 92 of the micrometer head 90 extends from the upper leg 72 to bear upon the top surface 94 of the support block 84. Preferably, the micrometer head 90 includes a scale 96 and is arranged so that the scale 96 may be read using the top surface 77 of the stand upper leg 72 as a reference line.

It can be appreciated that rotation of the micrometer head 90 will precisely adjust the position of the support block 84 relative to the test location 26. As will become clear upon reading this description, this adjustment permits positioning of the movable contact 54 so that capacitors 24 of various sizes may be slid between the stationary contact 44 and movable contact 54 for testing.

The movable contact 54 is connected to the support block 84 by a contact holder 98. The holder 98 is an elongated element having a rounded pivot end 100 that is pivotally fastened to one end 85 of the support block 84 via a shoulder screw 102 that passes through a hole 101 in the pivot end 100. The shoulder screw 102 defines a pivot axis 103 and is threaded through the side surface 104 of the support block 84.

The free end 106 of the holder 98 fits into a portion of a U-shaped bracket 108, which bracket 108 is attached to the side surface 104 of the block 84 at the end 87 of the block 84 that is opposite the end 85 to which the holder 98 is pivotally attached. The free end 106 of the holder 98 normally rests upon the base 110 of the U-shaped bracket 108 and is, therefore, prohibited from swinging beyond the bracket 108 in the clockwise direction (FIG. 1).

The free end 106 of the holder 98 is biased against the base 110 of the bracket 108 by a compression spring 112. Specifically, the lower end of the spring 112 fits around a pin 114 that protrudes from the top surface 116 of the free end 106 of the holder 98. An L-shaped spring retainer 118 is attached via a threaded fastener 120 to the base 110 of the U-shaped bracket 108. The retainer 118 is attached to the base 110 adjacent to the free end 106 of the holder 98 and extends upwardly from the bracket 108 to terminate in an arm 122 that extends over the free end 106 of the holder 98. The upper end of the compression spring 112 fits around a pin 124 that extends from the underside of the arm 122.

The holder 98 includes an integrally formed contact support piece 126 that protrudes downwardly from the mid-portion of the holder 98. The support piece 126 has an aperture 128 extending through it. The aperture 128 receives the shaft 55 of the headed pin that forms the movable contact 54. The head 57 of the contact 54 is held against the lower surface 130 of the support piece 126. Preferably, the lower surface 130 slopes upwardly away from the contact head 57 so that the support piece 126 does not interfere with movement of capacitors 24 into the test position 26.

The end 132 of the movable contact shaft 55 terminates within a recess 134 formed in the top surface 116 of the holder 98. That recess 134 is shaped to receive an electrically conductive terminal block 136 that serves to clamp the movable contact 54 in position and to provide means for connecting the contact 54 to the lead 58 that extends from the test bridge. The terminal block 136 is fastened within the recess 134 by a threaded fastener 138 that threads into the holder 98. Another fastener 139 is threaded into the terminal block 136 to secure the end of the lead 58 thereto.

One end of the terminal block 136 has a tongue 140 extending therefrom. The tongue 140 includes a flat clamp surface 142 that faces the end 132 of the contact shaft 55. The shaft end 132 extends across the clamp surface 142 of the tongue 140 near the junction of the tongue and the terminal block 136. The end 132 of the contact shaft 55 is clamped against the clamp surface 142 by a clamp member 144. The clamp member 144 is tightened against the shaft end 132 by a threaded fastener 146 that extends through the clamp member 144 and into a threaded aperture 148 formed in the clamp surface 142. The clamp member 144 resembles a conventional square nut and includes a protruding lip 150 that extends outwardly toward the clamp surface 142 for a distance equal to the diameter of the contact shaft 55. The lip 150 ensures that the clamp member 144 will bear evenly upon the shaft end 132. It can be appreciated that the movable contact 54 may be rapidly replaced by loosening the fastener 146 (hence, loosening the clamp member 144) so that the contact 54 is free to slide out of the contact support piece 126.

It can be appreciated that the test apparatus 20 of the present invention eliminates the need for complex mechanisms for moving probes because the contacts 44, 54 of the present invention undergo no driven displacement during the test procedure. More particularly, the test apparatus 20 is operated by first rotating the micrometer head 90 until the head 57 of the movable contact 54 is spaced from the head 45 of the stationary contact 44 a distance that is slightly less than the distance between the opposing terminal surfaces 52, 56 of the capacitor 24. Contact movement during the test operation is thereafter limited to that of the movable contact 54 as it is pushed slightly away from the stationary contact 44 by a capacitor 24 as the capacitor enters the test location 26. Unlike prior test devices, no test time is consumed while probes are positively driven toward and away from the capacitors that are tested. Further, because the movable contact 54 is held in position by the compression spring 112 mentioned earlier, both contacts 44, 54 press against the terminals 34, 36 as the capacitor 24 moves into the test location 26. Consequently, the contacts 44, 54 scrape through any oxide layer that may be present on the terminal surfaces 52, 56.

It is noteworthy that the test apparatus 20 is arranged so that the pivot axis 103 of the contact holder 98 extends in a plane that is substantially perpendicular to the direction traveled by the capacitors 24 as the capacitors move into the test location 26. This arrangement of the contact holder 98 ensures that the forces that are generated in the holder 98 as the capacitors 24 encounter the movable contact 54 will be directed substantially perpendicular to the pivot axis 103. As a result, practically no lateral forces (i.e., forces directed oblique to, or parallel with, the pivot axis 103) are generated in the contact holder 98, which lateral forces would tend to loosen the pivotal connection of the contact holder 98 to the support block 84.

Figure 5:
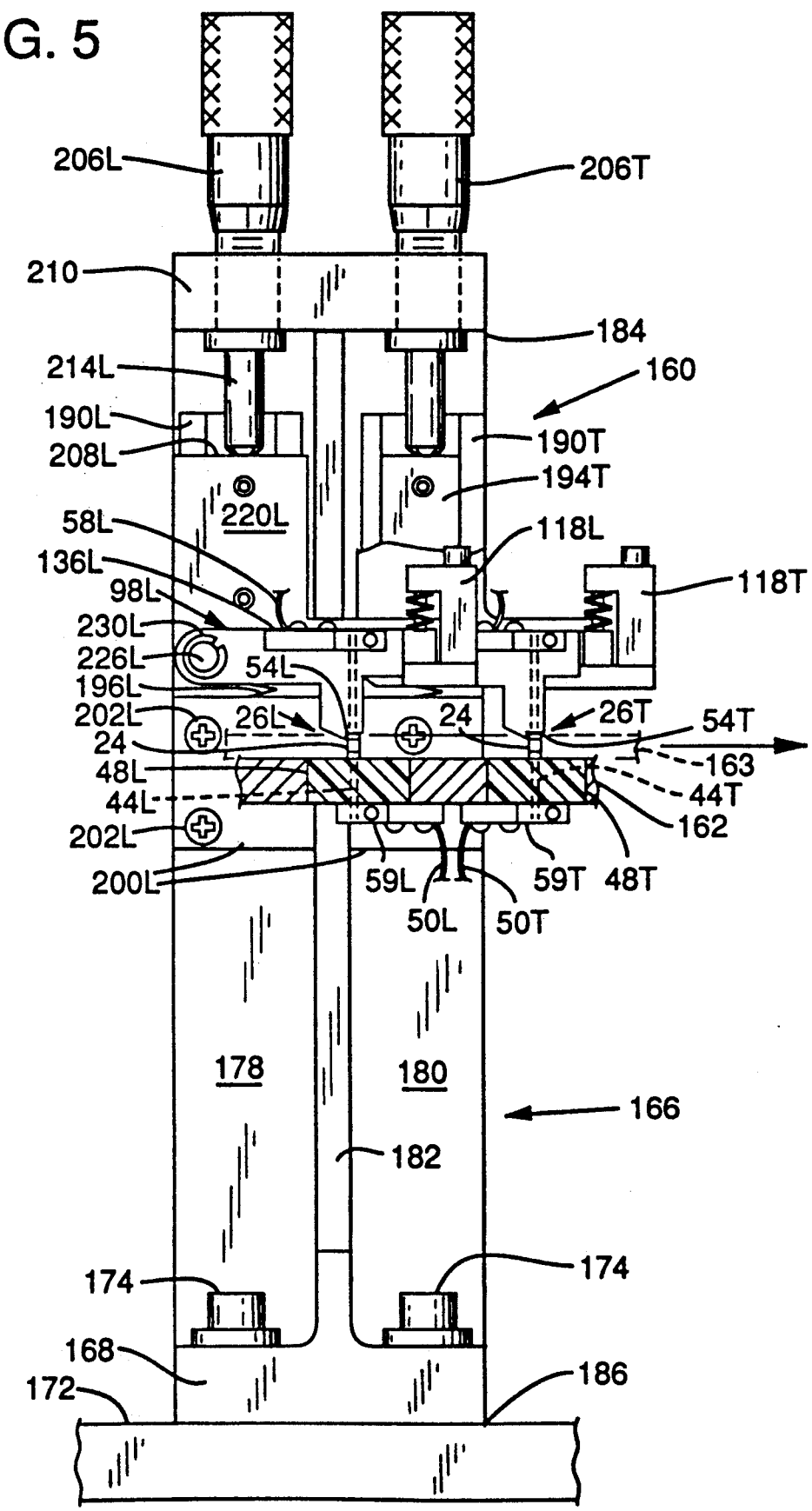
FIG. 5 is a front elevation view of the alternative embodiment of FIG. 4.

As shown in FIGS. 4 and 5, an alternative embodiment of the present invention provides a test apparatus 160 that has two adjacent test locations 26L, 26T and associated sets of stationary and movable contacts. Two test locations are useful for redundant testing of electronic components. Further, when capacitors are tested, the process is expedited by using one test location 26L to test the capacitance and dissipation factor of the capacitor 24, and using the other test location 26T to measure the dielectric withstand voltage of the capacitor.

The test location 26L and the test apparatus elements that first engage an untested capacitor 24 will be referred to as "leading." The other test location 26T and the associated test apparatus elements will be referred to as "trailing." Accordingly, where appropriate, reference numerals will contain the suffix L (leading) or T (trailing) to distinguish leading and trailing apparatus elements. Further, the alternative embodiment of the present invention includes several elements that are identical to corresponding elements in the first-described embodiment. Consequently, the same reference numerals are used in the drawings, and the descriptions of such elements are not repeated in detail.

As mentioned, two test locations 26L, 26T are used with the alternative embodiment of the test apparatus 160. Consequently, the base plate 162 of the rotary-type conveyance system includes two stationary contacts 44L, 44T that are held within respective support members 48L, 48T inset within the edge of the base plate 162 (see FIG. 5). The stationary contacts 44L, 44T are held in place by terminal blocks 59L, 59T as described earlier. Leads 50L, 50T extend from the respective terminal blocks 59L, 59T to the test bridge.

The test apparatus 160 also includes a tower 166 which, like the stand 60 of the first-described embodiment, supports the mechanisms for adjusting the position of movable contacts 54L, 54T relative to their associated stationary contacts 44L, 44T. The tower 166 is an elongated rigid member having a flanged foot 168. The tower 166 is fastened to an electrically nonconductive base 172 by threaded fasteners 174 that pass through the foot 168 and are threaded into the base 172.

The front 176 of the tower is formed with a flat leading support surface 178 and an adjacent flat trailing support surface 180. The trailing support surface 180 is recessed (relative to the leading support surface 178) within the front 176 of the tower 166. The significance of the recessed support surface relationship is described below.

The support surfaces 178, 180 of the tower 166 are separated by an outwardly protruding stiffening rib 182 that extends from the top 184 to the bottom 186 of the tower 166. The rib 182 has an elongated notch formed in its outermost edge to provide clearance for the edge of the base plate 162 and drive plate 163 of the electronic component conveyance system.

Looking first at the leading support surface 178 of the tower 166, a slide bracket 190L is fastened thereto near top 184 of the tower 166. The slide bracket 190L is U-shaped in cross section and is arranged to open outwardly from the leading support surface 178.

A slider block 194L fits within the opening of the slide bracket 190L and slides upwardly and downwardly therewithin. The slider block 194L is continuously urged upwardly by a compression spring 196L that engages the underside of the slider block 194L. Specifically, the lower end of the spring 196L is held within a cylindrical opening 198L formed in a retainer block 200L that is attached via a pair of fasteners 202L to the leading support surface 178. The retainer block 200L is beneath and spaced from the slide bracket 190L. The upper end of the spring 196L is fastened to the underside of the slider block 194L.

The position of the slider block 194L along the tower 166 (hence, the position of the movable contact 54L, which is connected to the slider block 194L as hereafter described) is adjusted by a micrometer head 206L that bears against the top surface 208L of the slider block 194L. More particularly, a top plate 210 is fastened to the upper end of the tower 166. The top plate 210 extends over the top surface 208L of the slider block 194L. The micrometer head 206L is threaded through the top plate 210. The stem 214L of the micrometer head 206L extends downwardly from the top plate 210L to bear upon the top surface 208L of the slider block 194L.

The leading movable contact 54L is fastened to a contact holder 98L that is substantially identical to the holder 98 described earlier. The contact holder 98L is connected to the slider block 194L by a support bracket 218L. The support bracket 218L includes a thin flat slide plate 220L that is fastened against the exposed side of the slider block 194L. The lower left (as seen in FIG. 4) corner of the slide plate 220L has an integrally formed cuboidal part 224L that protrudes outwardly therefrom. A pivot pin 226L extends from the cuboidal part 224L of the slide plate 220L. A circumferential groove 228L is formed in the outer end of the pivot pin 226L. The hole 101L in the pivot end 100L of the contact holder 98L fits around the pivot pin 226L and a snap ring 230L fits into the groove 228L to secure the pivotal connection of the holder 98L to the support bracket 218L.

The support bracket 218L includes a flat elongated arm 232L that extends outwardly from the cuboidal part 224L. The arm 232L is slightly longer than the contact holder 98L and carries on its outer end a U-shaped bracket 108L that is arranged to support the free end 106L of the holder 98L as described earlier with respect to the contact holder 98 of the embodiment shown in FIG. 1.

The free end 106L of the contact holder 98L is biased against the base 110L of the bracket 108L by a spring 112L that is secured by a retainer 118L.

The contact 54L is held within the holder 98L by a terminal block 136L. The lead 58L is attached to the terminal block 136L to connect the movable contact 54L with the test bridge.

The trailing support surface 180 supports an assembly (slide bracket 190T, slider block 194T, micrometer head 206T, contact holder 98T, etc.) for supporting the movable contact 54T, which assembly is identical to that described with respect to the leading contact 54L.

As noted earlier, the trailing support surface 180 is recessed relative to the leading support surface 180. As a result, trailing contact holder 98T is disposed near and generally parallel to the leading contact holder 98L. Further, the parallel arrangement of the contact holders 98T, 98L ensures that the pivot axes 103L, 103T of both contact holders will be oriented to extend in planes that are perpendicular to the direction the capacitors 24 travel as they move into the respective test locations 26L, 26T. As noted above, such an orientation of contact holders 98L, 98T minimizes lateral forces that are generated in the contact holders as a result of the capacitors 24 moving against the movable contacts 54T, 54L.

The nearness of the movable contacts 54L, 54T warrants shielding one contact from stray charges generated by the other. Accordingly, a thin shield 234 is attached via fasteners 236 to the side 238 of the support bracket arm 232L that faces the trailing contact holder 98T. The shield 234 is an electrically conductive member that is wrapped in insulating tape. The shield 234 is shaped to cover the side of the trailing contact holder 98T that faces the leading contact holder 98L. An insulated ground wire 240 is fastened to the conductive portion of the shield 234 to ground any stray charges. Insulating tape is also applied to the slide plate 220T to which the trailing contact holder 98T is attached. The tape eliminates stray charge transfer from the contact 54T to the adjacent support elements.

As noted earlier, it is often desirable to test components in such a way that the component terminals are not marked or damaged by the contacts of the test device. Accordingly, this invention provides in the alternative embodiment illustrated in FIGS. 6 and 7 a movable contact assembly that includes a contact that is arranged in cantilever fashion so that little contact force is produced as a component is slid between the movable and stationary contacts.

Figure 6:
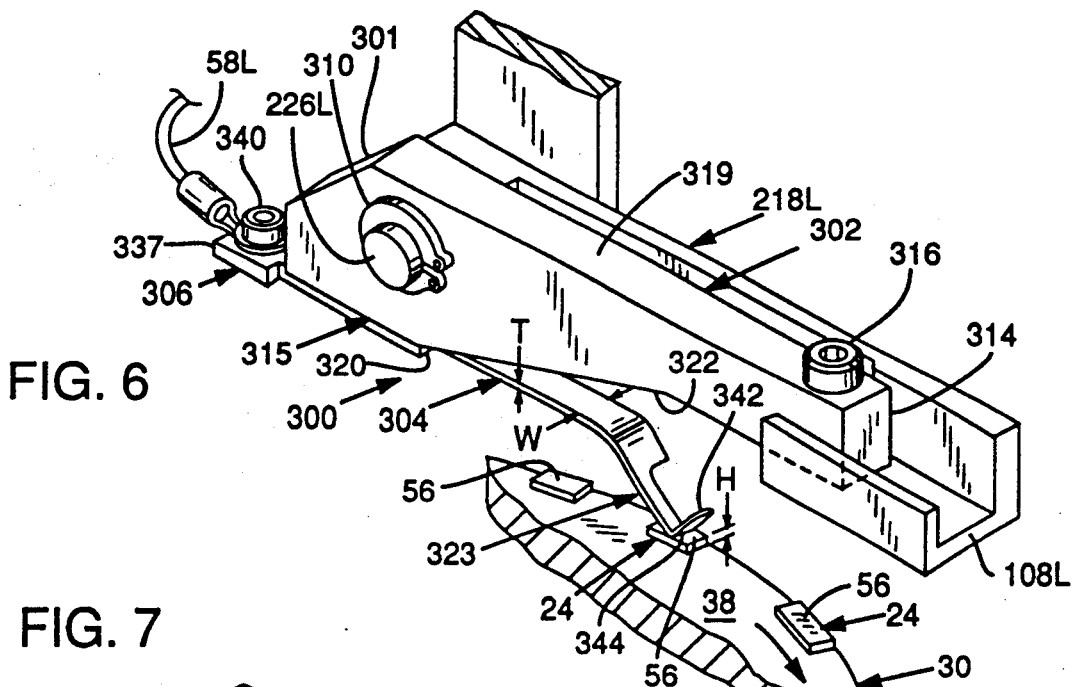
FIG. 6 is a perspective view of an alternative embodiment of a movable contact assembly that can be employed with either of the embodiments of FIGS. 1 and 4.
Figure 7:
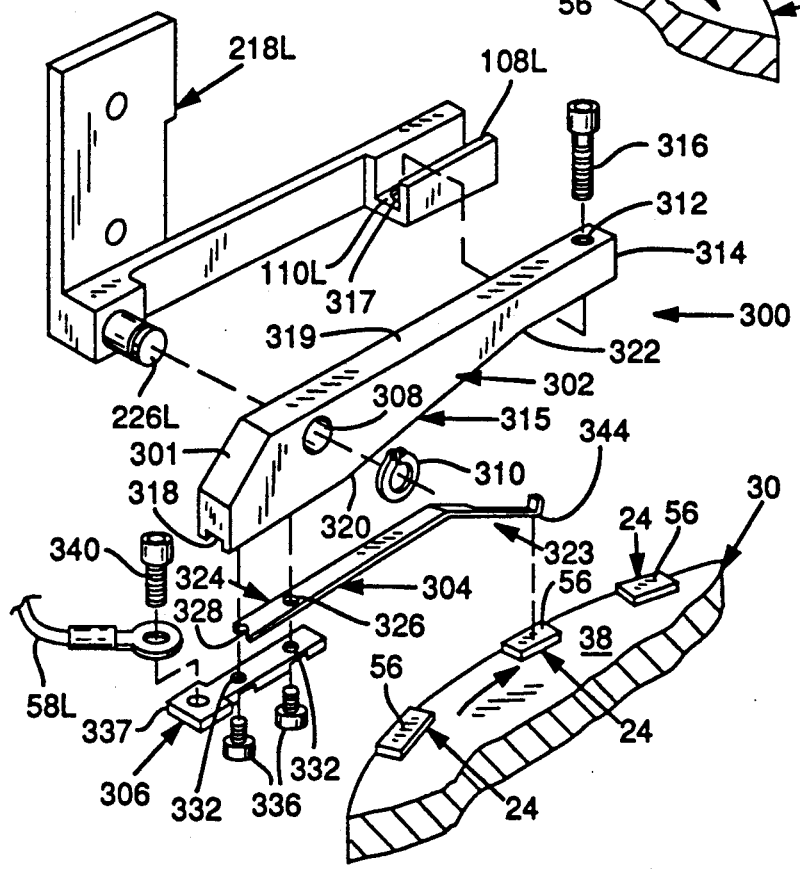
FIG. 7 is an exploded perspective view of the alternative embodiment of the movable contact assembly of FIG. 6.

Referring to FIGS. 6 and 7, the movable contact assembly 300 includes a contact holder 302, a flexible contact 304, and a clamp plate 306. The contact holder 302 is configured to be used as a substitute for the contact holder 98 described with respect to the embodiment shown in FIG. 1, or for the contact holders 98T, 98L described with respect to the embodiment shown in FIG. 4. For the purposes of this description, the contact holder 302 is depicted mounted to the leading support bracket 218L of the embodiment shown in FIG. 4.

The contact holder 302 is a generally elongated member formed of rigid insulating material. Near one end 301 of the contact holder 302 (the left end in FIG. 6) a transverse hole 308 is formed therethrough. The hole 308 is shaped to receive the above-described pivot pin 226L that is attached to the support bracket 218L. A snap ring 310 fits into the groove 228L formed in the end of the pivot pin 226L.

The contact holder 302, unlike the contact holders of the previously-described embodiments, does not pivot or otherwise move (relative to the support bracket 218L to which it is mounted) as a capacitor 24 is slid beneath the contact 304. More particularly, an aperture 312 is formed near the right end 314 of the contact holder 302. That end 314 is configured to fit within the U-shaped bracket 108L (or within the U-shaped bracket 108 of the embodiment shown in FIG. 1). A fastener 316 extends through the aperture 312 and is threaded into a hole 317 in the base 110L of the bracket 108L to fasten the right end 314 immovable relative to the bracket 108L.

The bottom 315 of the left end 301 of the contact holder 302 is generally flat and parallel to the flat top 319 of the contact holder 302, except for a groove 318 that extends inwardly from the left end 301 for approximately 25% of the length of the contact holder 302. From the inner end 320 of the groove 318, the bottom 315 of the contact holder 302 is inclined upwardly for approximately 40% of the length of the contact holder 302. From the uppermost end 322 of the tapered portion, the bottom 315 of the contact holder 302 extends substantially parallel to the top 319 of the holder 302. The configuration of the contact holder bottom 315 provides clearance for deflecting movement of the contact 304 as described more fully below.

The contact 304 is a thin, flat flexible member having a width W that is substantially greater than its thickness T. Preferably, the contact 304 is a beryllium/copper alloy having a modulus of elasticity of approximately $16 \times 10^6$ psi.

The contact 304 is attached to the holder 302 in cantilever fashion. Accordingly, the contact 304 has a free end 323 and a fixed end 324. The fixed end 324 of the contact 304 fits within the groove 318 in the bottom 315 of the left end 301 of the contact holder 302. The fixed end 324 is secured to the contact holder 302 by the flat, metal clamp plate 306. In this regard, the fixed end 324 of the contact 304 has an elliptical hole 326 formed through it, and the outermost portion of the fixed end 324 carries a curved notch 328. The elliptical hole 326 and curved notch 328 are aligned with threaded apertures (not shown) extending into the bottom 315 of the contact holder 302 at the left end 301 thereof. Similarly aligned counterbored holes 332 are formed in a portion 334 of the clamp plate 306 that fits over the fixed end 324 of the contact holder 302. Fasteners 336 having heads residing within the counterbored regions of the clamp plate holes 332 pass through the hole 326 and notch 328 in the contact 304 and are threaded into the apertures in the contact holder 302, thereby clamping the contact 304 to the holder 302.

One end 337 of the clamp plate 306 extends outwardly from beneath the holder bottom 315 and is slightly wider than the remaining portion of the clamp plate. That end 337 includes a threaded aperture 338. The aperture 338 receives a fastener 340 for securing the lead 58L to the clamp plate 306 thereby providing electrical connection between the contact 304 and the test bridge (not shown).

The fixed end 324 of the contact 304 is disposed in a plane that is generally parallel to the plane of the terminal surfaces 56 of the capacitors 24 that are moved into the test location 26L. The outermost 25% of the free end 323 of the contact 304 is inclined downwardly at an angle of approximately 45° from the plane of the fixed end 324 and terminates in a short, upwardly-turned lip 342. The lip 342 formed in the contact 304 provides a smooth contact portion 344 on the underside of the contact 304, that portion 344 being the portion of the contact 304 that engages the terminal surface 56 of the capacitor 24.

A sliding contact test apparatus having the contact assembly 300 shown in FIGS. 6 and 7 is adjusted (see the portion of this description pertaining to the slider block 194L and the micrometer head 206L) so that the contact portion 344 of the contact 304 resides within the space "H" between the top surface 38 of the drive plate 30 and the plane of the top surface 56 of the capacitor terminal.

With the contact 304 positioned as just described, a capacitor 24 that is slid into the test location 26L beneath the contact portion 344 will engage the contact portion so that the free end 323 of the contact 304 is deflected upwardly from the surface 56 of the capacitor. The reaction force imparted into the contact 304 as a result of this deflection is sufficient to cause the contact portion 344 (and the underlying stationary contact head 44, see FIG. 3) to penetrate the oxide layer on the terminal surfaces 52, 56.

In view of the above-described configuration of the contact, it can be appreciated the contact 304 behaves in a fashion substantially similar to a cantilever beam. In this regard, the force that is applied by the contact to the surface 56 of the capacitor terminal is proportional to the distance the free end 323 of the contact 304 is deflected, the magnitude of the force being a function of the contact length, modulus of elasticity and bending moment of inertia.

Accordingly, it can be appreciated that for a maximum available deflection distance (i.e., distance "H" in FIG. 6) the type of material and the cross sectional dimensions of the contact 304 may be selected so that the force applied by the contact portion 344 to the terminal surface 56 of the capacitor will be sufficient to penetrate the oxide layer on the surface, yet not so great that the terminal is marked or damaged by contact.

In the preferred embodiment, acceptable capacitor testing results, with no significant terminal damage, were achieved with a contact 304 that had a reduced cross sectional area (hence, a reduced bending moment of inertia) near the contact portion 344. In this regard, the free end 323 of the contact 304 was trimmed so that the cross sectional area of the contact was reduced by approximately 66% in the region of the contact portion 344.

The effect of reducing the bending moment of inertia of the contact 304 as described above is that a correspondingly reduced contact force will be generated for a given deflection of the free end 323 of the contact. Such minute changes in contact force per unit changes in deflection (the amount of deflection being adjustable by the operator of the apparatus) permits very precise adjustment of the contact force for achieving satisfactory capacitor testing without terminal marking.

While preferred embodiments of the invention have been described in detail, it should be apparent that many modifications and variations thereto are possible. For example, the contact 304 described above may be configured as a wire, or as a pair of separate wires joined at their free ends. Other changes and modifications will be obvious to those having skill in the art.

We claim:

1. An apparatus for testing electronic components that have terminals formed on opposing ends thereof, comprising:
   (a) a first contact;
   (b) a contact holder;
   (c) a second contact fastened to the contact holder; and
   (d) positioning means for continuously biasing the second contact into a position that is located a distance from the first contact, which distance is less than the distance between the terminals of the electronic components, wherein the positioning means includes a micrometric adjustment mechanism for changing the position of the contact holder.

2. The apparatus of claim 1 wherein the contact holder is connected to a support member that is mounted to a stand, and wherein spring means are carried by the stand and are arranged to continuously force the support member against the micrometric adjustment mechanism.

3. A method for testing electronic components that have terminals formed on opposing ends thereof wherein the electronic components are sequentially moved across the surface of a test location, the method comprising the steps of:
   (a) positioning a stationary contact to protrude from the surface of the test location so that one terminal of an electronic component that is moved into the test location slides along the stationary contact;
   (b) pivotally mounting a contact holder to an adjustable support member;
   (c) mounting a movable contact in the contact holder and positioning the movable contact in a non-testing position that is located a first distance from the stationary contact, the first distance being less than the distance between the terminals of the electronic components; and
   (d) continuously, indirectly biasing the movable contact by biasing the contact holder so that the movable contact is forced to slide along the other terminal of the electronic component that is moved into the test location.

4. The method of claim 3 further including the steps of:
   (a) positioning a trailing stationary contact to protrude from the surface of a trailing test location near the first-mentioned stationary contact;
   (b) mounting a trailing movable contact near the first-mentioned movable contact so that the trailing movable contact is positioned at the first distance from the trailing stationary contact; and
   (c) continuously, indirectly biasing the trailing movable contact by biasing a holder and/or a support thereof so that the trailing movable contact is forced to slide along the other terminal of the electronic component that is moved between the trailing stationary contact and the trailing movable contact.

5. The method of claim 4 wherein the electronic components are capacitors, the method further including the steps of:
   (a) testing the capacitance of a capacitor that is slid between the first-mentioned movable contact and the first-mentioned stationary contact; and
   (b) measuring the dielectric withstand voltage of the capacitor that is slid between the trailing movable contact and the trailing stationary contact.

6. The method of claim 4 further including the steps of adjustably mounting the first-mentioned movable contact and trailing movable contact to permit changes in the first distance to correspond to different sizes of electronic components.

7. An apparatus for testing electronic components that have terminals formed on opposing ends thereof, which components are sequentially moved across the surface of a leading test position and then across the surface of a trailing test position, comprising:
   (a) a leading stationary contact mounted to protrude from the surface of the leading test location;
   (b) a trailing stationary contact mounted to protrude from the surface of the trailing test location;
   (c) a stand;
   (d) an adjustable leading contact holder connected to the stand and having a leading movable contact fastened to protrude therefrom;
   (e) an adjustable trailing contact holder fastened to the stand and having a trailing movable contact fastened to protrude therefrom; and
   (f) positioning means for continuously, indirectly biasing the leading movable contact into a position that is located a first distance from the leading stationary contact, which distance is less than the distance between the terminals of the electronic components by biasing said leading contact holder and/or a support thereof, and for continuously, indirectly biasing the trailing movable contact into a position that is located a first distance from the trailing stationary contact by biasing said trailing contact holder and/or a support thereof, and adjustment means for adjusting the leading and trailing contact holders to accommodate components having a variety of dimensions between their opposing ends.

8. The apparatus of claim 7 further including shield means mounted between the leading contact holder and the trailing contact holder to shield one contact from electric charges that stray from the other contact.

9. An apparatus for testing electronic components that have terminals formed on opposing ends thereof, wherein the terminals are conveyed across a surface of a test location, the apparatus comprising:
   (a) a first electrically conductive contact protruding from the surface across which the components are conveyed;
   (b) an adjustable support member and a contact holder pivotally mounted to the support member;
   (c) a second electrically conductive contact mounted to the contact holder near the first contact; and
   (d) biasing means for continuously, indirectly biasing the second contact toward the first contact by biasing said contact holder and/or a support thereof so that the first and second contacts forcibly bear upon the terminals of an electronic component that is slid between the first and second contacts.

10. The apparatus of claim 9 further including clamp means fastened to the contact holder for releasably clamping the second contact to the contact holder.

11. The apparatus of claim 7, wherein said positioning means further provides for securing the leading movable contact so that the leading movable contact is movable away from the leading stationary contact whenever an electronic component is slid between the leading movable and leading stationary contacts, and for securing the trailing movable contact so that the trailing movable contact is movable away from the trailing stationary contact whenever an electronic component is slid between the trailing movable and trailing stationary contacts.

12. The apparatus of claim 9, wherein the contact holder is an elongated element having one end pivotally connected to the support member and a free end, and the biasing means includes a spring mounted for continuously biasing the free end of the contact holder against a part of the support member, the free end of the contact being movable against the spring and away from the part whenever an electronic component is slid between the first and second contacts.

* * * * *